(12) United States Patent
Shao et al.

(10) Patent No.: US 6,821,846 B2
(45) Date of Patent: Nov. 23, 2004

(54) METHOD OF FORMING CONTACT

(75) Inventors: Yao-Ting Shao, Hsinchu (TW); Ishibashi Shigeru, Kanagawa-ken (JP)

(73) Assignee: Winbond Electronics Corp., Hsinchu (TW)

(*) Notice: Subject to any disclaimer, the term of this patent is extended or adjusted under 35 U.S.C. 154(b) by 0 days.

(21) Appl. No.: 10/248,520

(22) Filed: Jan. 27, 2003

(65) Prior Publication Data

US 2003/0235978 A1 Dec. 25, 2003

(30) Foreign Application Priority Data

Jun. 24, 2002 (TW) .......................... 91113726 A

(51) Int. Cl.$^7$ .......................................... H01L 21/8242
(52) U.S. Cl. ............................................... 438/253
(58) Field of Search ................................ 438/253, 256, 438/396

(56) References Cited

U.S. PATENT DOCUMENTS 6,406,968 B1 * 6/2002 Chien et al. ............... 438/381
6,537,874 B2 * 3/2003 Nakamura et al. ........ 438/253
6,545,306 B2 * 4/2003 Kim et al. .................. 257/296
6,562,679 B2 * 5/2003 Lee et al. ................... 438/253
2002/0022317 A1 * 2/2002 Fukuzumi .................. 438/253

* cited by examiner

Primary Examiner—David Neims
Assistant Examiner—Quoc Hoang
(74) Attorney, Agent, or Firm—Jiang Chyun IP Office

(57) ABSTRACT

A method of manufacturing a contact is disclosed. A substrate is provided, and a first dielectric layer and a metal layer are formed thereon in sequence. A second dielectric layer is formed on the metal layer and the first dielectric layer. A bottom contact is formed in the second dielectric layer to electrically connect to the metal layer. A node contact is formed in the first and second dielectric layers. A capacitor is formed on the dielectric layer to electrically connect to the node contact, and a middle contact is formed on the second dielectric layer to electrically connect to the bottom contact. A third dielectric layer is formed on the capacitor, the middle contact and the second dielectric layer. A top contact is formed in the third dielectric layer to electrically connect to the middle contact.

13 Claims, 8 Drawing Sheets

METHOD OF FORMING CONTACT

CROSS REFERENCE TO RELATED APPLICATIONS

This application claims the priority benefit of Taiwanese application serial no. 9113726, filed on Jun. 24, 2002.

BACKGROUND OF INVENTION

1. Field of the Invention

The present invention relates to a method of forming a memory device. More specifically, the present invention relates to a method of forming a contact of a device.

2. Description of the Related Art

A dynamic random access memory (DRAM) can work with only one transistor and one capacitor. It has many advantages such as high integration, lowered production cost, superior reading/programming performance, and considerable capacitance of memory, and therefore has been widely used.

Further, as the integration of the integrated circuit increases, the area of a semiconductor device decreases. An embedded DRAM has been developed accordingly to integrate a memory cell array and a logic circuit array into a chip. The above memory has high access speed, which can be applied in a high-loading data processing system such as an image processing system. A logic circuit is operated by using a MOS transistor as a switch. An "ON" or "OFF" status is determined by a gate of the MOD transistor. For example, "ON" status of the MOS transistor is referred to as 1, and "OFF" status of the MOS transistor is referred to as 0.

In a conventional stacked DRAM, a cylindrical capacitor gets higher as the stacked DRAM needs more capacitance for storing charges. For a control circuit in the logic circuit region, a contact connects a topmost metal layer (I/O control) to a metal layer that is formed simultaneously with a bit line. The contact has a height that is equal to the sum of the dielectric layer above the capacitor, the capacitor, and the dielectric layer between the capacitor and the bit line. The contact is deeper as the capacitor is higher. Therefore, the contact has a considerable aspect ratio, which makes etching of a contact opening and filling a conductive material into the contact opening more difficult.

SUMMARY OF INVENTION

It is one object of the invention to provide a method of forming a contact, which reduces an aspect ratio of the contact formed in a logic circuit region.

It is another object of the invention to provide a method of forming a contact, which requires less time to etch a contact opening.

In one aspect of the invention, the method of the invention provides a substrate having an active device thereon. A first dielectric layer is formed over the substrate. A first metal layer is formed on the first dielectric layer. A second dielectric layer is formed on the first metal layer and the first dielectric layer. A bottom contact is formed in the second metal layer to electrically connect the first metal layer, and a node contact is formed in the first and second dielectric layers to electrically connect the active device of the substrate. A first capacitor is formed on the second dielectric layer to electrically connect to the node contact, and a middle contact is formed on the second dielectric layer to electrically connect to the bottom contact. A third dielectric layer is formed on the first capacitor, the middle contact and the second dielectric layer. A top contact is formed in the third dielectric layer to electrically connect to the middle contact. The middle contact can be formed simultaneously with the first capacitor. The bottom contact, the middle contact and the top contact constitute an objective contact of the invention, which is significantly different from a conventional high-aspect-ratio contact.

Because the objective contact of the invention consists of the top contact, the middle contact, and the bottom contact, each of which has lower aspect ratio, the prior problems with respect to high aspect can be avoided.

Furthermore, there is no problem with respect to high aspect when etching a contact opening to form the contact in the logic circuit region. The etching time can be reduced.

The top contact is compatible with the original design rule of the contact. The middle contact is formed together with the capacitor. Only one mask is required for forming the bottom contact. Therefore, the method of the present invention can be compatible with the prior process, without complicating the whole manufacture process.

BRIEF DESCRIPTION OF DRAWINGS

It is to be understood that both the foregoing general description and the following detailed description are exemplary, and are intended to provide further explanation of the invention as claimed.

The accompanying drawings are included to provide a further understanding of the invention, and are incorporated in and constitute a part of this specification. The drawings illustrate embodiments of the invention and, together with the description, serve to explain the principle of the invention. In the drawings.

DETAILED DESCRIPTION

Figure 1A:
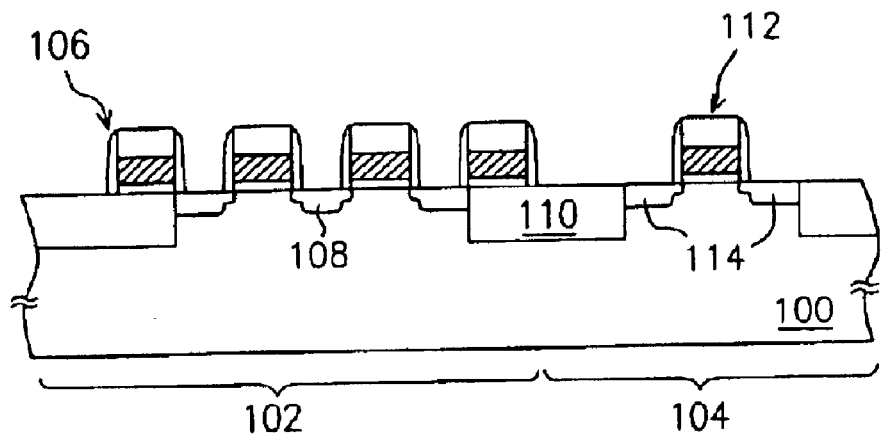
FIG. 1A to FIG. 1J show a method of forming a contact according to one preferred embodiment of the present invention.

Reference will now be made in detail to the present preferred embodiments of the invention, examples of which are illustrated in the accompanying drawings. Whenever possible, the same reference numbers are used in the drawings and the description to refer to the same or like parts.

With reference to FIG. 1A, a substrate 100 includes a cell region 102 and a logic circuit region 104. A plurality of gates 106 are formed in the cell region 102 of the substrate 100. A source/drain region 108 is formed at each side of each gate 106 in the substrate 100. The gate 106 formed next to the logic circuit region 104 is isolated from the logic circuit region 104 by a shallow trench isolation 110. A plurality of gates 112 are formed in the logic circuit region 104 of the substrate 100. A source/drain region 114 is formed at each side of each gate 112 in the substrate 100. Then, a dielectric layer 116 is formed over the substrate to cover the gates 106,112, the source/drain regions 108, 114, and the shallow trench isolation 110. The dielectric layer 116 can be formed of silicon oxide, for example, by chemical vapor deposition.

Figure 1B:
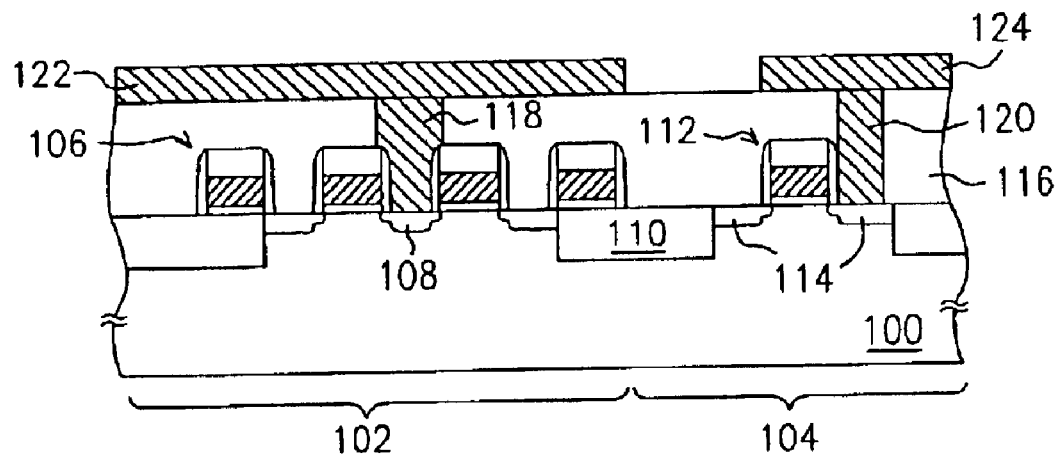

With reference to FIG. 1B, a bit line contact 118 is formed in the dielectric layer 116 in the cell region 102. A contact 120 is formed on the dielectric layer 116 in the logic circuit region 104. Also, a bit line 122 is formed on the bit line contact 118 and the dielectric layer 116 in the cell region 102, and a metal layer 124 is formed on the contact 120 and the dielectric layer 116 in the logic circuit region 104.

Forming the bit line contact 118 and the contact 120 can be achieved by, for example, forming a bit line contact opening (not shown) in the dielectric layer 116 in the cell region 102 and forming a contact opening (not shown) in the dielectric layer 116 in the logic circuit region 104 at the same time. Then, a conductive layer (not shown) is formed over the substrate 100 to fill the bit line contact opening and the contact opening. Thereafter, the conductive layer is defined to form the bit line 122 in the cell region 102 and the metal layer 124 in the logic circuit region 104.

Figure 1C:
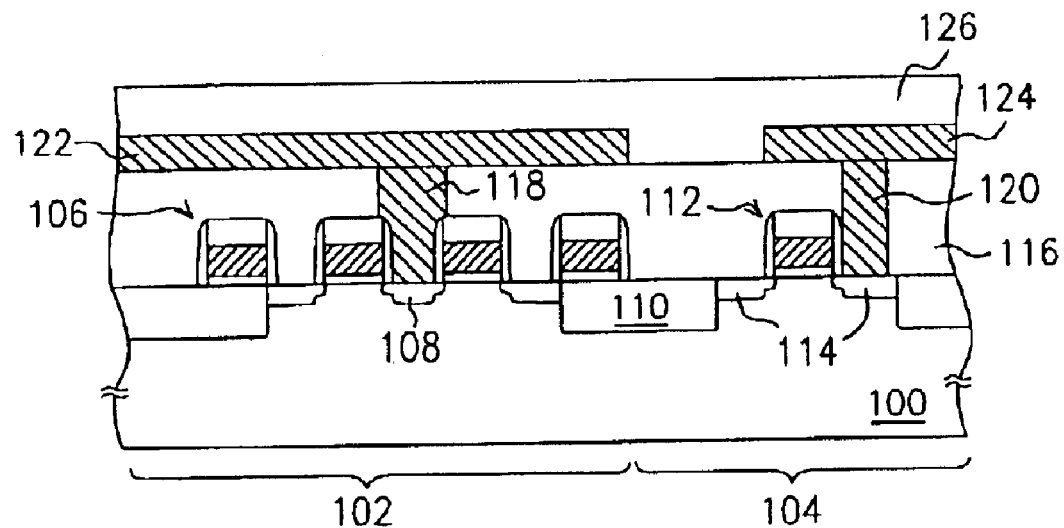

With reference to FIG. 1C, a dielectric layer 126 is formed over the substrate 100. The material of the dielectric layer 126 can be silicon oxide, for example. The dielectric layer 126 can be obtained by forming a material layer (not shown) by using a high density plasma chemical vapor deposition (HDCVD) process, and planarizing the material layer by using a chemical mechanical polishing (CMP) process.

Figure 1D:
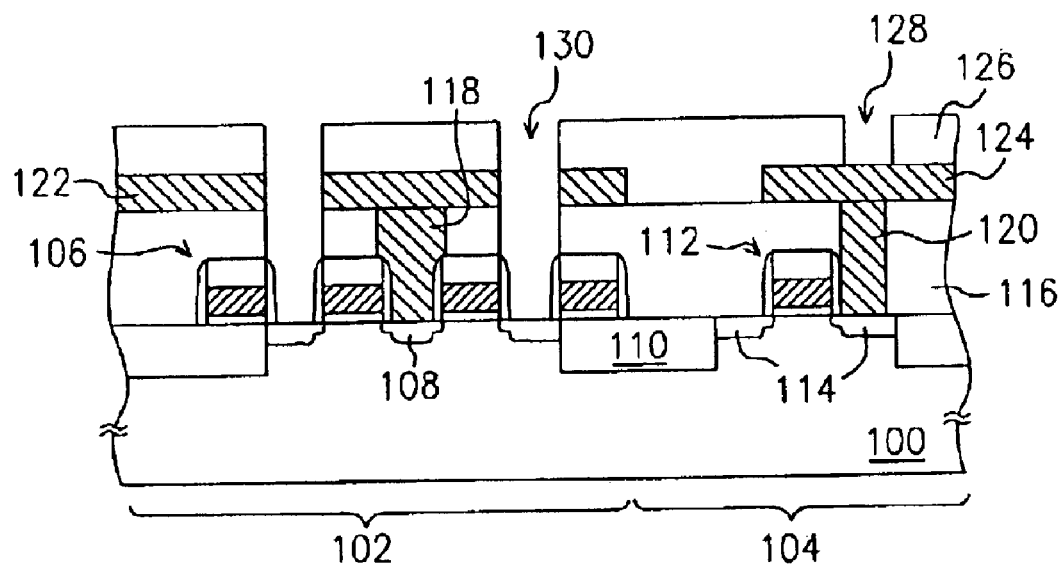

With reference to FIG. 1D, a bottom contact opening 128 is formed in the dielectric layer 126 in the logic circuit region 104. The method of forming the bottom contact opening 128 includes forming a patterned photoresist (not shown) on the dielectric layer 126; etching the dielectric layer 126 in the logic circuit region 104 using the patterned photoresist as a mask to form the bottom contact opening 128 that exposes the metal layer 124 thereunder; and then removing the photomask.

Subsequently, a node contact opening 130 is formed in the cell region 102. The method of forming the node contact opening 130 includes forming a patterned photoresist (not shown) on the dielectric layer 126; etching the dielectric layers 126, 116 in the cell region 102 by using the patterned photoresist as a mask to form the node contact opening 130 that exposes the source/drain 108 thereunder; and then removing the patterned photoresist.

Because the layers to which a bottom contact is electrically connected are different from those a node contact is electrically connected to, the bottom contact opening 128 can not be formed together with the node contact opening 130 in the same etching process. An additional mask is thus needed to form the bottom contact opening 128. However, this additional step can be compatible with a conventional process.

Figure 1E:
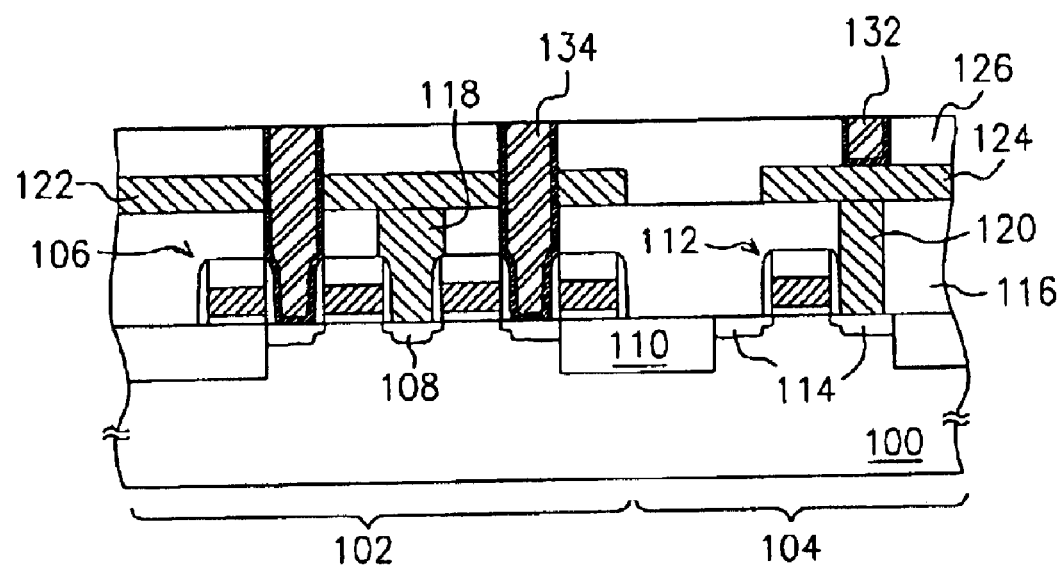

With reference to FIG. 1E, a bottom contact 132 is formed in the logic circuit region 104, and a node contact 134 is formed in the cell region 102. The method of forming the bottom contact 132 and the node contact 134 includes forming a conformal barrier layer (not shown) to the bottom contact opening 128, the node contact opening 130, and the dielectric layer 126; forming a conductive material layer on the dielectric layer 126 to fill the bottom contact opening 128 and the node contact opening 130; and then partially removing the conductive material layer and the barrier layer by CMP until the dielectric layer 126 is exposed. The barrier layer can be formed of titanium/titanium nitride, for example, by sputtering. The conductive material layer can be formed of polysilicon, aluminum, tungsten, and copper, for example, by sputtering or CVD.

Figure 1F:
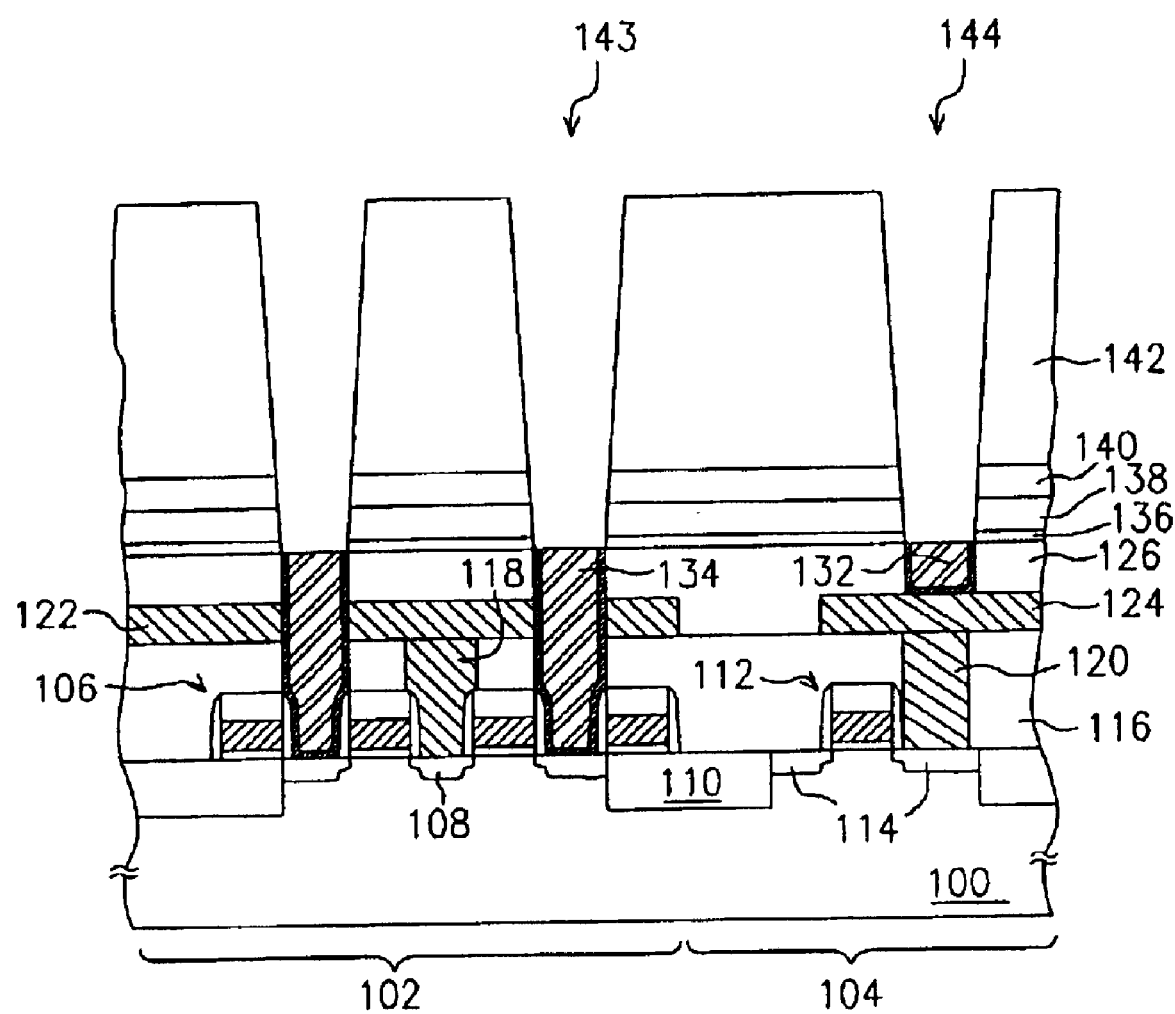

With reference to FIG. 1F, a dielectric layer 136, a dielectric layer 138, a dielectric layer 140 and a dielectric 142 are formed in sequence on the dielectric 126. The dielectric layer 136 can be formed of silicon nitride and used as an etching stop for forming a storage node (a lower electrode of the capacitor). The dielectric layer 138 can be formed of silicon oxide such as tetraethylorthosilicate (TEOS). The material of dielectric layer 140 can be silicon nitride. The dielectric layers 138, 140 serve to support the storage node. The material of the dielectric layer 142 can be silicon oxide such as TEOS. The above-mentioned dielectric layers are formed by different CVD processes, based on their constitutive materials. Then, openings 143, 144 are formed respectively in the dielectric layers 136, 138, 140, 142 in the cell region 102 and the logic circuit region 104 at the same time to expose the node contact 134 in the cell region 102 and the bottom contact 132 in the logic circuit region 104.

Figure 1G:
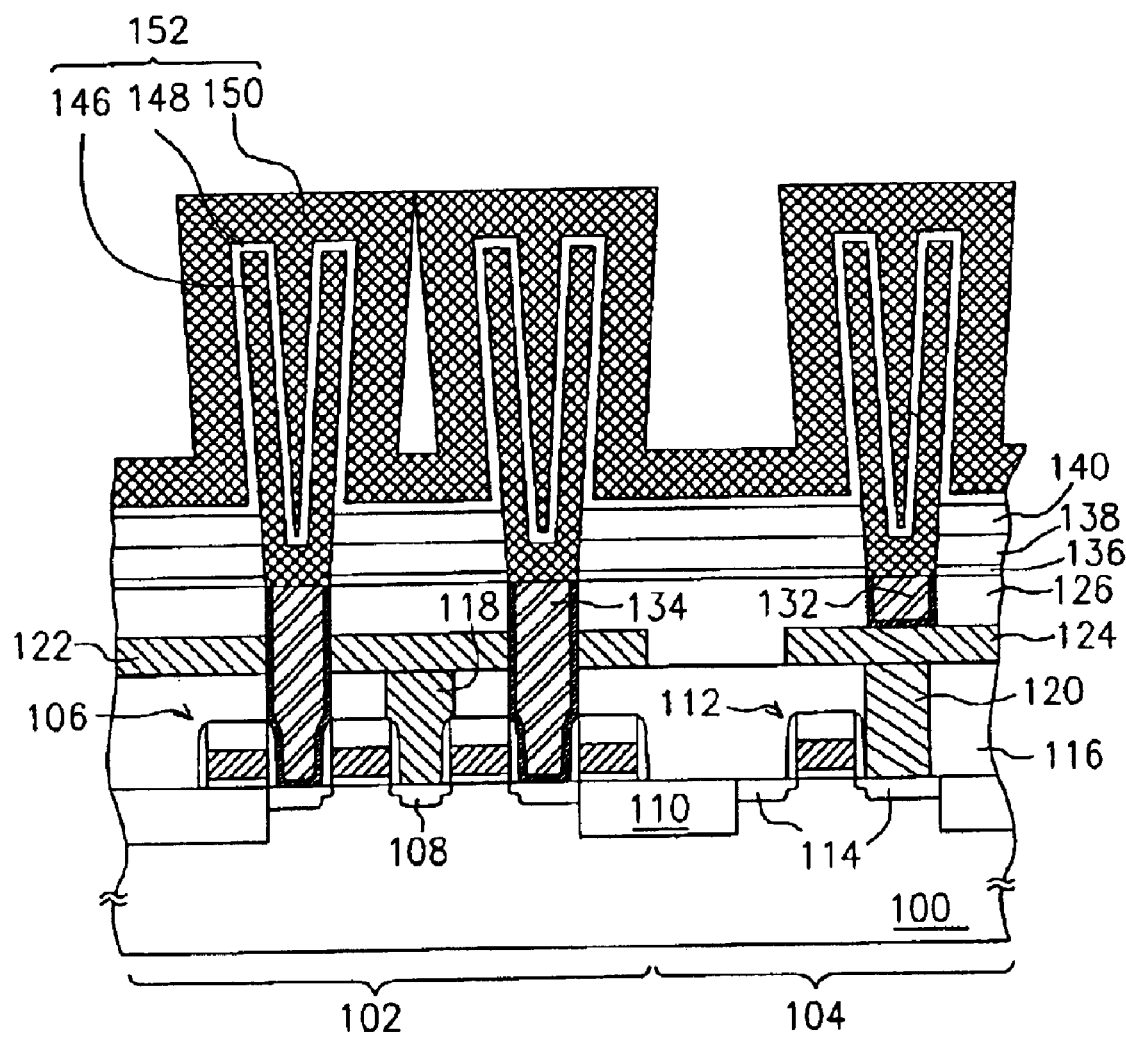

With reference to FIG. 1G, capacitors 152 are respectively formed in the cell region 102 and the logic circuit region 104. Each of the capacitors 152 consists of a lower electrode 146, a dielectric layer 148 and an upper electrode 150. The method of forming the capacitors 152 includes forming metal layers 146 each of which is conformal to the interior surfaces of the openings 143, 144 and used as the lower electrode; removing the dielectric layer 142 to maximize a contact area of the lower electrode 146; forming a conformal dielectric layer 148 on each of the lower electrodes; and then forming a metal layer (upper electrode) 150 on each dielectric layer 148. The upper electrode 146 and the lower electrode 150 can be formed of ruthenium (Ru), for example, by sputtering. The material of the dielectric layer 148 includes $Ta_2O_5$. The dielectric layer 148 can be formed by CVD, for example.

Figure 1H:
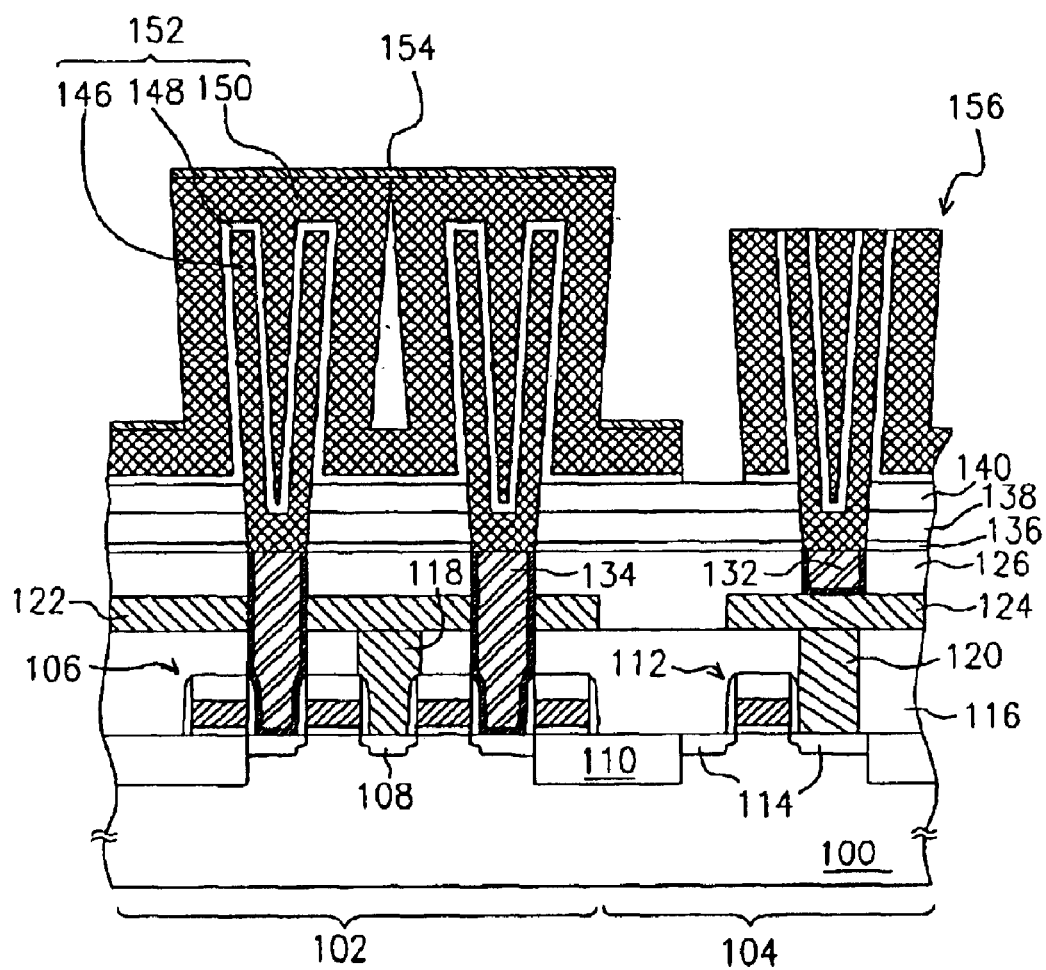

With reference to FIG. 1H, a flat metal layer 154 is formed over the substrate 100. The flat metal layer 154 can be formed of titanium nitride/ruthenium, for example, by sputtering. Then, a portion of the flat metal layer 154 is defined such that the cell region 102 and the logic circuit region 104 are electrically disconnected. Meanwhile, the capacitor 152 in the logic circuit region 104 is defined such that the flat metal layer 154 thereon, a top portion of the upper electrode 150, and a portion of the dielectric layer 148 are removed to partially expose the upper electrode 146. The remaining capacitor is used as a middle contact 156.

In view of FIG. 1G to FIG. 1H, the mask used to form the device in the logic circuit region 104 is used such that the process for forming the middle contact 156 to beis compatible with the process for forming the capacitor. Therefore, no additional processing is required to form the middle contact 156.

Figure 1I:
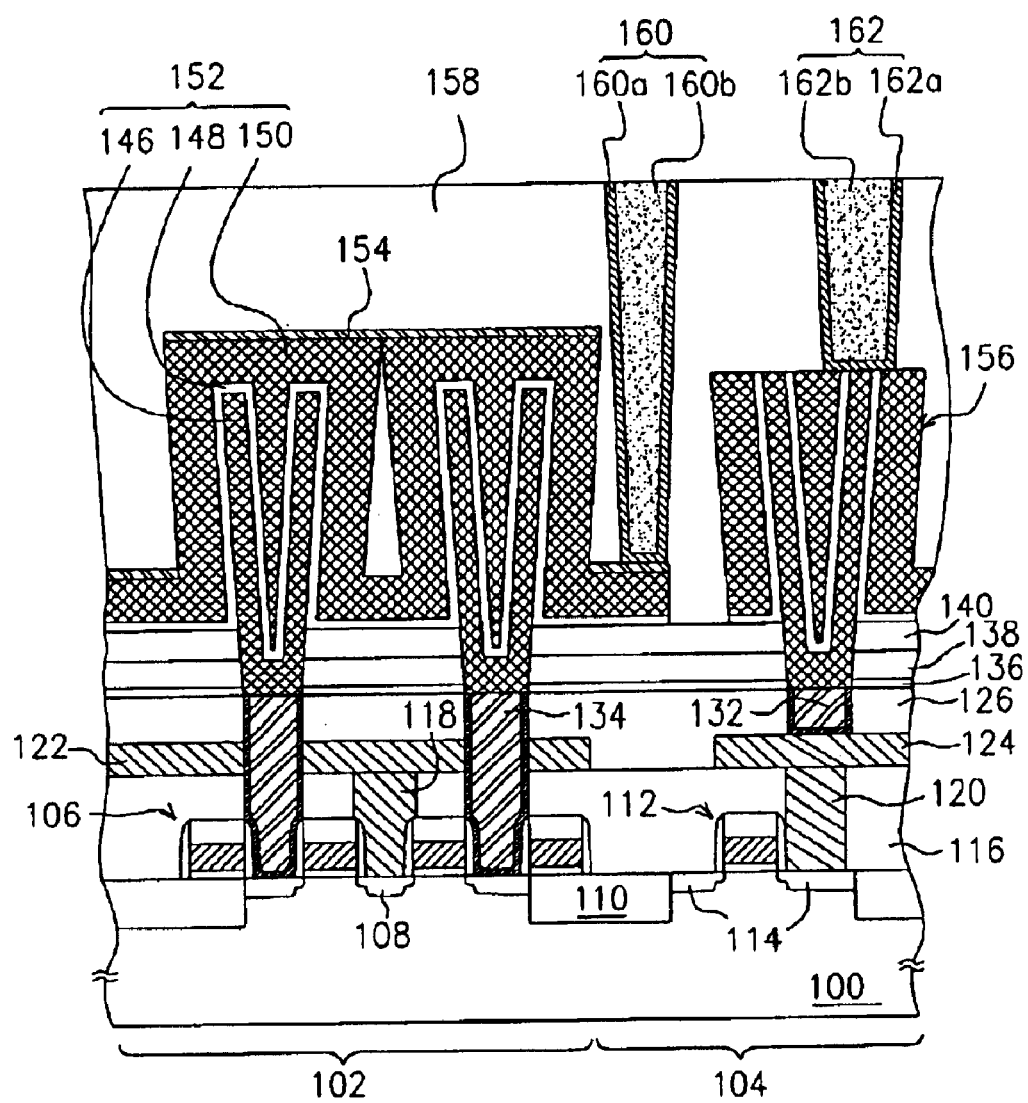

With reference to FIG. 1I, a dielectric layer 158 is formed over the substrate 100. The dielectric layer 158 can be formed of TEOS, for example, by CVD. Then, a contact 160 electrically connecting the flat metal layer 154, and a top contact 162 electrically connecting the middle contact 156 are formed in the dielectric layer 158. The method of forming the contact 160 and the top contact 162 includes forming a patterned photoresist (not shown) on the dielectric layer 158; etching the dielectric layer 158 by using the patterned photoresist as a mask to form a contact opening (not shown) and a top contact opening (not shown); and sequentially forming a conformal barrier layer 160a and a metal layer 160b in the contact opening, and sequentially forming a conformal barrier layer 162a and a metal layer 162b in the top contact opening. The barrier layers 160a, 162a can be formed of titanium/titanium nitride, for example, by sputtering. The metal layers 160b, 162b can be formed of polysilicon, aluminum, tungsten, and copper, for example, by sputtering or CVD.

By the steps shown in FIG. 1D to 1I, the bottom contact 132, the middle contact 156, and the top contact 162 are formed as an objective contact according to one embodiment of the present invention.

Figure 1J:
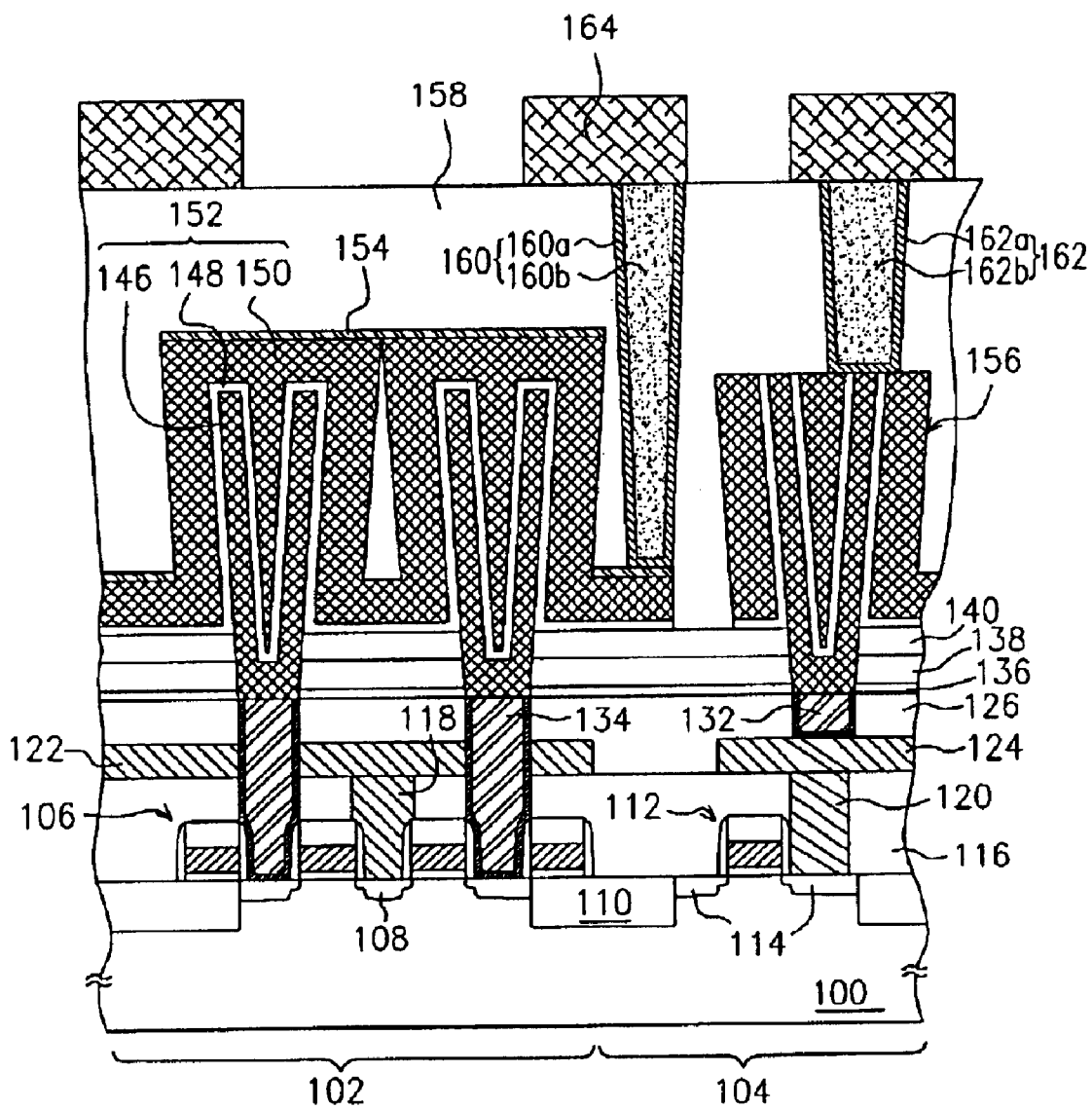

Finally, with reference to FIG. 1J, the photoresist is removed. A topmost metal layer 164 is formed on the dielectric layer 158 and electrically connected to the contact 160 and the top contact 162. Thereby, an embedded dynamic random access memory (DRAM) is accomplished.

In view of foregoing, the present invention is characterized in that the contact with high aspect ratio includes the top contact, the middle contact and the bottom contact. The three contacts constituting the objective contact are formed in separate steps, so that prior problems regarding theto high aspect ratio of the contact opening can be prevented.

Since there is no problem in etching the high-aspect-ratio contact opening to form the contact in the logic circuit region, the etching time can be reduced.

Further, the process for forming the top contact is compatible with the original design rule of the contact. The middle contact can be formed together with the capacitor. Only an additional mask is needed for forming the bottom contact opening. Therefore, the process for forming the objective contact of the present invention can be compatible with the conventional process, not complicating the whole manufacture process.

It will be apparent to those skilled in the art that various modifications and variations can be made to the structure of the present invention without departing from the scope or spirit of the invention. In view of the forgoing, it is intended that the present invention cover modifications and variations of this invention provided they fall within the scope of the following claims and their equivalents.

What is claimed is:

1. A method of manufacturing a DRAM, comprising:
   providing a substrate having a cell region and a logic circuit region, wherein the substrate has a first dielectric layer on the cell region and the logic circuit region, and wherein a bit line is formed on the first dielectric layer of the cell region and a first metal layer is formed on the first dielectric layer of the logic circuit region;
   forming a second dielectric layer on the bit line, the first dielectric layer and the first metal layer;
   forming a bottom contact in the second dielectric layer of the logic circuit region to electrically connect to the first metal layer, and forming a node contact in the first and second dielectric layers of the cell region to electrically connect to one active device on the substrate;
   forming a first capacitor on the second dielectric layer of the cell region and a second capacitor on the second dielectric layer of the logic circuit region, the first capacitor electrically connecting to the node contact and the second capacitor electrically connecting to the bottom contact, wherein a top portion of an upper electrode and a portion of the capacitor dielectric layer of the second capacitor are removed, and wherein a remaining portion of the upper electrode of the second capacitor serves as a middle contact electrically connecting the bottom contact;
   forming a third dielectric layer on the first capacitor, the middle contact and the second dielectric layer; and
   forming a top contact in the third dielectric layer of the logic circuit region to electrically connect to the middle contact.

2. The method of claim 1, wherein the step of forming the bottom contact and the node contact comprises:
   forming a bottom contact opening in the second dielectric layer of the logic circuit region, wherein the bottom contact opening exposes the first metal layer;
   forming a node contact opening in the first and second dielectric layers of the cell region, wherein the node contact opening exposes the active device of the substrate; and
   filling a conductive material into the bottom contact opening and the node contact opening to form the bottom contact and the node contact.

3. The method of claim 1, wherein the middle contact is formed after forming the first capacitor.

4. The method of claim 1, wherein the step of forming the first capacitor comprises:
   sequentially forming a fourth dielectric layer, a fifth dielectric layer, a sixth dielectric layer and a seventh dielectric layer on the second dielectric layer;
   defining the seventh dielectric layer, the sixth dielectric layer, the fifth dielectric layer and the fourth dielectric layer to form a plurality of openings each of which exposes either the node contact or the bottom contact;
   forming a second metal layer conformal to each of the openings, wherein the second metal layer is used as a lower electrode of the capacitor;
   removing the seventh dielectric layer to increase the contact area of the second metal layer;
   forming a conformal eighth dielectric layer on the second metal layer; and
   forming a third metal layer on the eighth dielectric layer, wherein the eighth dielectric layer is used as an upper electrode of the first capacitor.

5. The method of claim 4, wherein the second metal layer and the third metal layer are formed of ruthenium.

6. The method of claim 4, wherein the material of the eighth dielectric layer is $Ta_2O_5$.

7. The method of claim 1, wherein the step of forming the first capacitor and the middle contact further comprises:
   sequentially forming a fourth dielectric layer, a fifth dielectric layer, a sixth dielectric layer and a seventh dielectric layer on the second dielectric layer;
   defining the seventh dielectric layer, the sixth dielectric layer, the fifth dielectric layer and the fourth dielectric layer to form a first opening for forming the node contact in the cell region, and form a second opening for forming the bottom contact in the logic circuit;
   forming a third metal layer conformal to each of the openings, wherein the third metal layer is used as a lower electrode of the capacitor;
   removing the seventh dielectric layer to increase the contact area of the third metal layer;
   forming a conformal eighth dielectric layer on the third metal layer;
   forming a fourth metal layer on the eighth dielectric layer to form the first capacitor on the node contact and form a second capacitor on the bottom contact;
   forming a flat metal layer on the fourth metal layer; and
   defining the flat metal layer and the fourth metal layer so that the second capacitor is electrically disconnected from the first capacitor, and the fourth metal layer and the eighth dielectric layer of the second capacitor are partially removed to form a middle contact.

8. The method of claim 1, wherein the material of the top contact is selected from polysilicon, aluminum, tungsten, and copper.

9. The method of claim 1, wherein the material of the bottom contact is selected from polysilicon, aluminum, tungsten, and copper.

10. A method of forming a contact in a DRAM, comprising:
    providing a substrate comprising a logic circuit region;
    sequentially forming a first dielectric layer, a metal layer and a second dielectric layer over the logic circuit region;

forming a bottom contact over the second dielectric layer electrically connecting to the first metal layer;

forming a capacitor over the second dielectric layer of the logic circuit region electrically connecting to the bottom contact, wherein a top portion of an upper electrode and a portion of capacitor dielectric layer of the capacitor are removed, and wherein a remaining portion of the upper electrode of the capacitor serves as a middle contact;

forming a third dielectric layer over the middle contact; and forming a top contact in the third dielectric layer of the logic circuit region to electrically connect to the middle contact.

11. The method of claim 10, wherein the step of forming the capacitor further comprises:

sequentially forming a fourth dielectric layer, a fifth dielectric layer, a sixth dielectric layer and a seventh dielectric layer on the second dielectric layer;

defining the seventh dielectric layer, the sixth dielectric layer, the fifth dielectric layer and the fourth dielectric layer to form a plurality of openings each of which exposes either the node contact or the bottom contact;

forming a second metal layer conformal to each of the openings, wherein the second metal layer is used as a lower electrode of the capacitor;

removing the seventh dielectric layer to increase the contact area of the second metal layer;

forming a conformal eighth dielectric layer on the second metal layer;

forming a third metal layer on the eighth dielectric layer to form a first capacitor on the node contact and form the capacitor on the bottom contact;

forming a flat metal layer on the third metal layer; and defining the flat metal layer and the third metal layer so that the capacitor is electrically disconnected from the first capacitor, and the capacitor, the third metal layer and the eighth dielectric layer are partially removed to form the middle contact.

12. The method of claim 11, wherein the first metal layer and the second metal layer comprises ruthenium.

13. The method of claim 11, wherein a material of the third dielectric layer is $Ta_2O_5$.

* * * * *